US 8,812,165 B1

(12) United States Patent
Smith et al.

(10) Patent No.: US 8,812,165 B1
(45) Date of Patent: Aug. 19, 2014

(54) ELECTRIC GRID OPTIMIZATION

(75) Inventors: Raiford Smith, Mooresville, NC (US); Melanie Miller, York, SC (US); Pedram Mohseni, Charlotte, NC (US); David Masters, Kannapolis, NC (US)

(73) Assignee: Duke Energy Corporation, Charlotte, NC (US)

( * ) Notice: Subject to any disclaimer, the term of this patent is extended or adjusted under 35 U.S.C. 154(b) by 399 days.

(21) Appl. No.: 13/350,443

(22) Filed: Jan. 13, 2012

Related U.S. Application Data

(60) Provisional application No. 61/438,850, filed on Feb. 2, 2011.

(51) Int. Cl.
| | |
|---|---|
| *G01R 19/25* | (2006.01) |
| *G01R 21/00* | (2006.01) |
| *G01R 21/06* | (2006.01) |
| *G05B 11/32* | (2006.01) |
| *G05B 13/02* | (2006.01) |
| *G05B 13/04* | (2006.01) |
| *G05D 3/12* | (2006.01) |
| *G06F 9/44* | (2006.01) |
| *G06Q 50/06* | (2012.01) |
| *H02J 3/00* | (2006.01) |
| *H02J 3/14* | (2006.01) |
| *G01R 22/06* | (2006.01) |
| *H02J 13/00* | (2006.01) |

(52) U.S. Cl.
CPC ............ *G01R 19/2513* (2013.01); *G01R 22/06* (2013.01); *G05B 11/32* (2013.01); *G05B 13/02* (2013.01); *G05B 13/024* (2013.01); *G05B 13/042* (2013.01); *G06F 8/24* (2013.01); *G06F 9/4428* (2013.01); *G06F 9/443* (2013.01); *G06F 9/4433* (2013.01); *G06Q 50/06* (2013.01); *H02J 3/14* (2013.01); *H02J 13/0086* (2013.01)
USPC ............... 700/291; 700/28; 700/32; 700/286; 700/295; 702/60; 702/61; 717/116; 717/153; 717/165

(58) Field of Classification Search
CPC .... G01R 19/2513; G01R 22/06; G05B 11/32; G05B 13/02; G05B 13/024; G05B 13/042; G06F 8/24; G06F 9/4428; G06F 9/443; G06F 9/4433; G06Q 50/06; H02J 3/0008; H02J 3/0086; H02J 3/14; Y04S 20/222; Y04S 20/224; Y04S 70/3225
USPC .......... 700/28, 32, 33, 286, 291, 295; 702/60, 702/61; 717/116, 153, 165
See application file for complete search history.

(56) References Cited

U.S. PATENT DOCUMENTS

| | | | | |
|---|---|---|---|---|
| 5,650,936 | A | * | 7/1997 | Loucks et al. .................. 702/62 |
| 7,062,361 | B1 | * | 6/2006 | Lane ............................. 700/295 |

(Continued)

FOREIGN PATENT DOCUMENTS

| | | |
|---|---|---|
| GB | 2442760 A | 4/2008 |
| GB | 2464625 A | 4/2010 |

OTHER PUBLICATIONS

Rosenfield, Michael G. "The Smart Grid and Key Research Technical Challenges," *VLSI Technology Symposium*, Jun. 15-17, 2010, pp. 3-8.

(Continued)

*Primary Examiner* — Mohammad Ali
*Assistant Examiner* — Jennifer L Norton
(74) *Attorney, Agent, or Firm* — Nelson Mullins Riley Scarborough LLP

(57) ABSTRACT

Various embodiments are directed to systems and methods for optimizing energy use with one or more optimization engine objects. An optimization engine object may have a plurality of dependent objects including at least a dependent optimization engine object, or at least one of a supply-side or demand-side object. The optimization engine object may receive dependent object attribute data from each of the at least one dependent objects; determine an optimal configuration for the plurality of dependent objects over the first time period subject to at least one optimization constraint; and conditioned upon the optimization engine depending from a superior optimization engine, transmit a net energy usage associated with the optimal configuration to the superior optimization engine.

21 Claims, 11 Drawing Sheets

(56) References Cited

U.S. PATENT DOCUMENTS

| | | |
|---|---|---|
| 7,612,446 B2 | 11/2009 | Dang |
| 7,680,540 B2 | 3/2010 | Jensen |
| 7,769,416 B2 | 8/2010 | Wei |
| 7,949,435 B2 | 5/2011 | Pollack |
| 2002/0035620 A1* | 3/2002 | Takahashi et al. ............ 709/220 |
| 2002/0198629 A1* | 12/2002 | Ellis .............................. 700/286 |
| 2003/0225483 A1* | 12/2003 | Santinato et al. ............. 700/295 |
| 2004/0138786 A1* | 7/2004 | Blackett et al. ............... 700/295 |
| 2006/0036675 A1 | 2/2006 | Crichlow |
| 2009/0012916 A1 | 1/2009 | Barnett |
| 2009/0012918 A1 | 1/2009 | Aron |
| 2010/0049737 A1 | 2/2010 | Ambrosio |
| 2010/0076835 A1 | 3/2010 | Silverman |
| 2010/0217550 A1 | 8/2010 | Crabtree |
| 2010/0274405 A1 | 10/2010 | Thomas |
| 2011/0035073 A1 | 2/2011 | Ozog |
| 2011/0082597 A1 | 4/2011 | Meagher |
| 2011/0106328 A1 | 5/2011 | Zhou |
| 2011/0166959 A1 | 7/2011 | Winter |

OTHER PUBLICATIONS

Gulich, Oleg, "Technological and Business Challenges of Smart Grid, Aggregator's Role in Current Electricity Market," *Lappeenranta University of Technology, Master's Thesis, Electrical Engineering*, 2010.

* cited by examiner

ELECTRIC GRID OPTIMIZATION

PRIORITY CLAIM

This application claims the benefit of U.S. Provisional Application Ser. No. 61/438,850 filed on Feb. 2, 2011, which is incorporated herein by reference in its entirety.

BACKGROUND

Modern electric grids include many generation and transmission resources used to provide power to different types of customer loads. Generation and transmission resources may include generators, transmission lines, sub-stations, reclosers, transformers, etc. These resources, and different instances thereof, have different capabilities, settings, and limitations. For example, each generation resource has a total as well as a marginal cost. Different combinations of transmission resources may allow specific customer loads to be connected to different generation sources, although increased physical distance between a generation source and a load may lead to reduced efficiency due to transmission losses.

Customer loads also come in different types, having different characteristics. For example, residential customers require power for heating and cooling equipment, such as heaters, air conditioners, etc., as well as for lighting, dish washers, hot water heating, clothes washers, etc. Business and industrial customers require power for lighting, computer and information systems, as well as for industrial machinery such as large and small electric motors, furnaces, etc. Each load has different and often unique characteristics. For example, different loads draw different levels of power (kW), reactive power (kVAR), and energy (kVA). Also, different loads have different temporal placements and reliability requirements, often based on the requirements of the customer.

Electric grid management attempts to match grid-connected generation and transmission resources to load. Existing management systems, however, are centralized, utility-operated mechanisms that are implemented in a one-way, top-down manner. According to the existing systems, generation output and grid configuration settings are determined centrally based on the information available to the central control mechanism and the preferences of the utility. Often, however, centralized control in this manner leads to sub-optimal financial and operational configurations of the electric grid because the centralized mechanisms fail to take into consideration the needs of some or all of the participants in the grid (e.g., customers and the utility).

FIGURES

Various embodiments of the present invention are described here by way of example in conjunction with the following figures, wherein.

DESCRIPTION

Figure 1:
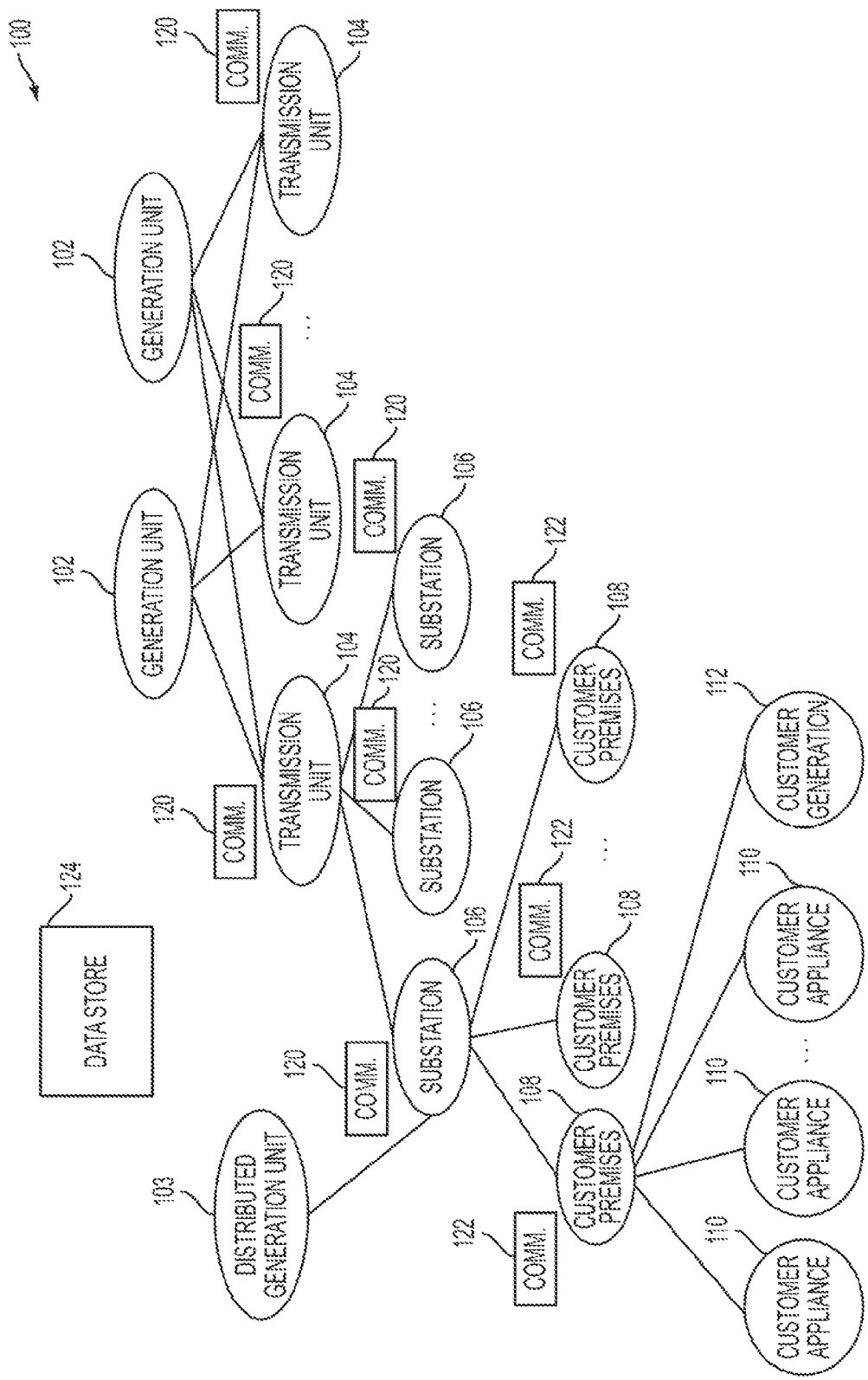
FIG. 1 illustrates one embodiment of an example electric grid that may be managed by optimization engines, as described herein.

Various embodiments are directed to distributed, object-oriented systems for managing electric grid components such as generation components, transmission components, and, in some embodiments, load components, as well as methods for operating the same. A utility, or other grid management provider, may implement a plurality of optimization engines that may be distributed logically and/or physically across the electric grid to optimize electric grid components. The optimization engines may be programmed to consider each electric grid component, and other optimization engines, as objects described by certain attributes and responsive to certain commands. For example, electric grid objects may be described by electricity generated or consumed (e.g., measured in energy, power and/or capacitance) and may respond to commands regarding activation, operation level, etc.

Each optimization engine may be assigned to monitor, analyze and optimize one or more electric grid objects (e.g., generation objects, transmission objects, load objects, other optimization engines, etc.). For example, each optimization engine may independently optimize and allocate electricity between its assigned/dependent objects. If an optimization engine has an assigned or dependent object that is another optimization engine, the dependent optimization engine may be instructed to institute its own optimization, and the results may be considered by the first optimization engine. In this way, the optimization may be multi-layered. In various embodiments, the optimization may also be multi-dimensional. For example, the optimization may be made considering different dimensions of generated electricity (e.g., energy, capacitance, power, harmonics, etc.), limitations posed by the physical properties of the grid (e.g., supplying too much power to one customer may cause a voltage sag to other customers), as well as customer preferences. In some embodiments, customer preferences include both predetermined customer preferences and forecasted change in preferences (e.g., due to the position of the customer relative to the customer's point of connection of the electric grid such as a home or business). The position of the customer may be determined, for example, based on a position of a mobile device and/or demand side object (e.g., electric vehicle) associated with the customer.

The optimal allocation at any given optimization engine may or may not balance. That is, the optimization engine may or may not be able to match the output of all of its assigned generation objects to all of its assigned load objects (e.g., the optimization engine may have a positive or negative imbalance of commodities). In cases where an optimization engine cannot optimally balance, its imbalance of commodities may be pushed up to a second optimization engine assigned responsibility for the unbalanced optimization engine. The second optimization engine may then optimize and allocate electricity among its assigned objects, including the unbalanced optimization engine. Any imbalance of commodities at the second optimization engine may again be pushed up and re-balanced at a higher level. The process may be repeated until the electric grid as a whole is optimized.

Before providing example details of the optimization engines, a description of an example electric grid is provided. FIG. 1 illustrates one embodiment of the example electric grid 100 that may be managed by optimization engines, as described herein. The grid 100 may comprise electric components as well as communications system components. The electric components may comprise equipment for generating, transmitting and consuming electricity. Example electric components include generation units 102, transmission units 104, substation units 106, distributed generation units 103, customer premises 108, customer appliances 110 and customer generation units 112. The electric components may have a variety of different states. For example, different customers may be connected to different generation units 103 via different substation units 106 depending on the switching configuration of the grid 100. Generation units 102 may be any sort of equipment for generating electricity including, for example, coal-fired generators, natural gas generators, nuclear generators, hydro-electric generators, etc. Generation units 102 may have capabilities described in terms of power (e.g., measured in kilowatts or kW), energy (e.g., measured in kilovolt-amps or kVA), or capacitance (e.g., measured in kilovolt-amps-reactive or kVAR).

Generation units 102 may transmit generated electricity via one or more transmission units 104. The transmission units 104 may comprise power lines including, for example, high-voltage power lines, as well as other transmission equipment. Substations 106 may receive electricity from the transmission units 104 and distribute it to customer premises 108. Additional transmission and distribution equipment (not shown) may be included in the electric grid 100 including, for example, reclosers, transformers, etc.

The customer premises 108 may comprise various customer appliances 110, which may be demand-side or load objects. Examples of customer appliances may include heating and air conditioning equipment, dishwashers, hot water heaters, washing machines, dryers, etc. Business and/or industrial customer premises may have different kinds of customer appliances including, for example, computer or information systems equipment, industrial motors, etc. In various embodiments, some customer premises may have grid-connected generation equipment 112 such as, for example, solar panels, wind turbines, fuel-powered generators, etc. Customer generation equipment 112 may be configured to provide power to the electric grid 100 in some situations. Also, for example, the electric grid 100 may comprise other distributed generation units 103. Distributed generation units 103 may be conventional fossil fuel or nuclear powered or renewable generation units, such as solar or wind generation units. Distributed generation units 103 may not be centrally located on the grid (e.g., to take advantage of geography-specific fuel sources). Also, different system components may other be in service or out of service. A Geographic Information System (GIS System) may be used to monitor and update a current configuration of the electric components of the grid, including their geographic location, capability, and connectivity. In various embodiments, the GIS system may not directly monitor customer premises 108, appliances 110 or generation units 112. In some embodiments, however, the GIS system is used by optimization engines (described below) to determine the logical and physical configuration of the optimization problems.

In addition to the electric components, the electric grid 100 may comprise communications system components, such as the communications nodes 120, 122. The communications nodes 120, 122 may be in communication with one another, for example, via one or more wired or wireless network components (not shown in FIG. 1). In various embodiments, communications nodes 120 may be implemented by the utility operating the grid 100 and may comprise various sensors, servers, and/or communications equipment (e.g., routers, servers, etc.) for monitoring the electric components. For example, in various embodiments, the GIS system may be implemented utilizing the communications nodes 120. Current and historic operations data describing the electric components may be stored at a data store 124. The data store 124 may be centrally located, or may comprise multiple physical devices physically and/or logically distributed throughout the electric grid 100. Utility communication nodes 120 may comprise sensing and communications equipment provided by the utility to monitor its equipment on the electric grid. Examples of equipment suitable for use as utilities nodes 120 are available from AMBIENT and ECHELON. Customer communication nodes 122 may comprise any equipment in communication with the utility communications nodes 120 and used to monitor and/or control customer appliances 110 and/or generation units 112. Customer communication nodes 122 may be provided by the utility (e.g., purchased or rented from the utility) or may comprise one or more third-party home energy controller (HEC) systems, such as those available from CISCO and GENERAL ELECTRIC. In some embodiments, customer communication nodes 122 may also comprise other customer equipment described herein, such as cellular or mobile phones, palmtop or tablet computers, laptop computers, desktop computers, etc. A diagram showing example grid and communication system connectivities (e.g., utilizing a GIS system) is provided at FIG. 10 and described below.

Although example connectivities between the various generation units 102, 103, transmission units 104, substations 106 and customer premises 108 are shown in FIG. 1, it will be appreciated that many other states of the electric grid 100 are possible including, for example, alternative connectivities between components. Different grid connectivities may be achieved by modifying the settings of transmission and distribution equipment, such as transmission units 104, substations 106 as well as transformers, re-closers, etc. Also, it will be appreciated that the properties of some components may be modified, e.g., by embodiments of the distributed management system described herein. For example, customer appliances 110 may be turned on or off and, for some appliances, consumption levels may be set. Additionally, generation units 102, 103, may be turned on and off, and for some units; a generation level may be set. Some or all of the grid configurations described herein may be modifiable by the optimization engines to achieve an optimal grid configuration. The GIS system, as described herein, may monitor a current state of the non-customer equipment on the grid 100.

As described above, the electric grid 100 may be managed and/or optimized by implementing a plurality of object-oriented optimization engines. The optimization engines may be executed on dedicated equipment or may, in various embodiments, be implemented by existing equipment (e.g., communications nodes) operating as part of the communications network described above. For example, the optimization engines may take advantage of existing data and/or command connections with electric components of the grid 100 to monitor and/or control the electric system components. Logically, each component of the electric grid 100, and the optimization engines themselves, may be considered as an object having an inheritable schedule of attributes and/or commands. One class of electric system component object may include utility controlled objects. These may be objects, such as generation, transmission and distribution objects, that are, at least partially, under the control of the utility and, therefore, may be controlled by the optimization engines. Utility controlled objects, in some embodiments, may also include some customer appliances 110. For example, as described herein, a customer may consent to allow the utility (e.g., via an optimization engine) to, at least partially, control the operation of some customer appliances. Another class of objects may include customer controlled objects. The utility may not have the right and/or capability to modify the operation of customer controlled objects (e.g., via the optimization engines). Accordingly, the optimization engines may merely monitor customer controlled objects.

Figure 2:
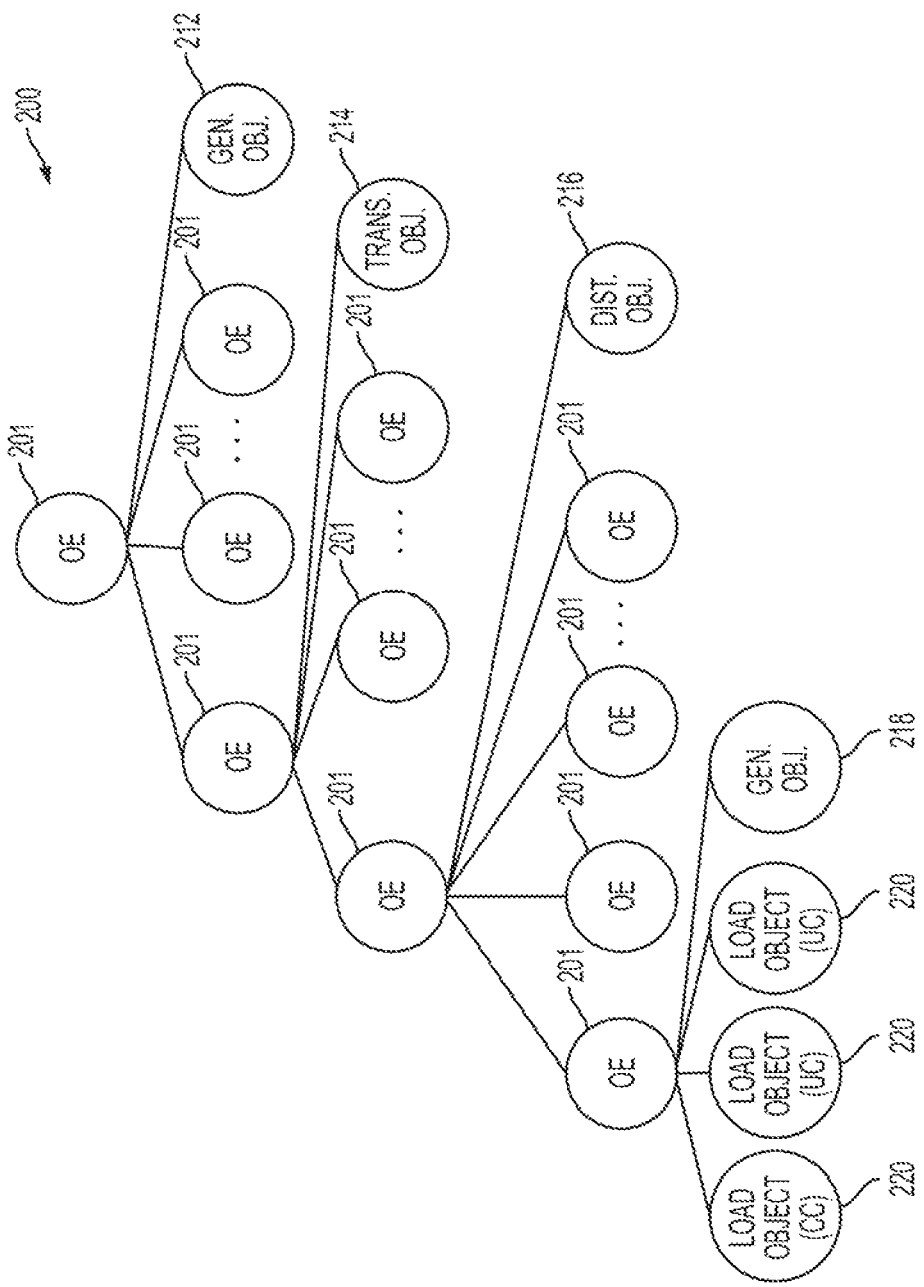
FIG. 2 shows one embodiment of a logical hierarchy of electric grid objects.

The various objects may be logically arranged according to a hierarchy that may be structured considering the physical constraints of the electric components and the communications network. For example, related objects may correspond to electric components on the grid 100 that are electrically connected to one another and connected via the communication network such that communication is not cost-prohibitive. FIG. 2 shows one embodiment of a logical hierarchy 200 of electric grid objects. Each electric grid 100 component to be optimized and each optimization engine may have an object in the hierarchy 200. For example, the hierarchy 200 comprises a plurality of optimization engine (OE) objects 201, as well as generation objects 212, 218, distribution objects 216, transmission objects 214 (e.g., supply-side objects) and load objects 220, 222 (e.g., demand-side objects). Each of the non-OE objects 212, 214, 216, 218, 220, 222 may correspond to a physical electric component of the electric grid 100 having a specific geographic location. Some non-OE objects may be customer-controlled (e.g., customer controlled load object 222), while others may be utility controlled (e.g., utility controlled load object 220). Also, it will be appreciated that non-load objects, such as generation object 212, customer generation object 218, transmission object 214 and distribution object 216 may be utility and/or customer controlled. Each object, including the non-OE objects, may have associated attributes or property for a fixed period of time (e.g., past, present and/or future). For example, if a load object 220, 222 is a water heater, one property may be present time usage of the water heater. Historic and/or projected future use of the water heater (or other load object 220, 222) may also be considered.

As illustrated in FIG. 2 by connective lines, various objects in the hierarchy 200 may depend on other objects. For example, when a first object depends on a second object, the second object may monitor and control the first object. Dependency between a first object and a second object, in various embodiments, may be determined based on the proximity of the objects in the electric grid and the communications network and/or the relative proximity of the objects to the supply and demand sides. For example, objects may be dependent on one another if the electric components corresponding to electric components that are presently connected on the grid 100 in a manner allowing interaction. It will be appreciated, that as the state of the grid 100 changes (e.g., as indicated by the GIS system), dependencies between different objects may also change.

According to various embodiments, each non-OE object may depend on an OE object 201. Also, each OE object 201 may have at least one dependent object (e.g., a non-OE object, an OE object or both). In various embodiments, each OE object 201 may be configured to operate as both a dependent and an independent object. For example, if an OE object 201 that depends on another OE object 201 loses its state (e.g., loses contact with its parent OE object 201, such as during a service interruption), it may retain control and management of its dependent objects, using last known preferences. In this way, if the physical layers of the electric grid 100 (e.g., the grid and/or the communication system) experience a failure; each OE object 201 may be able to operate independently for a period of time.

Each individual OE object 201 may be configured to optimize and allocate the resources and loads of the objects that depend on it. For example, each OE object 201 (and each logical layer of the hierarchy 200) may sense, monitor and analyze at its respective layer (e.g., its dependent objects). In this way, control and analysis of the electric grid 100 maybe pushed down to the various objects at all layers. For example, each OE object 201 may make an independent determination about what is happening among its locally connected (e.g., dependent) objects, sensing the available resources and determining how to proceed independent of OE objects positioned higher in the hierarchy 200. In this way, because the design may not be tied to a centralized controller, reliability and security may be improved, providing a more robust system. Further, because data analysis is distributed, there may not be a need to send all data to any central location, reducing data transfer traffic and related expenses.

Each OE object 201 may inherent input data from its dependent objects. The input data may comprise a schedule of net resources (e.g., energy, power and/or capacitance producing capability of generation objects), a schedule of net demands (e.g., energy, power and/or capacitance-consuming objects), and preferences (e.g., customer billing preferences, customer consumption preferences, and/or utility preferences) associated with the dependent objects. Given the input data, the OE object 201 may attempt to schedule the resources and load objects that depend directly or indirectly from the OE object 201 in the most economically rational manner based on the intelligence of interconnected OE objects 201, customer preferences, utility preferences, etc., as described herein. When an OE object 201 is unable to balance dependent load objects with dependent generation and/or distribution objects, the OE object 201 may show an imbalance of commodities (positive or negative), which may be provided to the OE object's superior OE object 201. The superior OE object 201 may see the first OE object 201 as another object with its own properties (e.g., a balance or imbalance of commodities along with any other pass-through preferences).

OE objects 201 may receive and/or generate customer and/or utility preferences in any suitable manner. For example, an OE object 201 having dependent customer load objects 222, 220 may receive billing and consumption preferences directly from the customer. In various embodiments, a customer may provide some or all of the customer preferences via a home energy controller (HEC) or other suitable interface (e.g., "I come home at 6:00 p.m. and want the house to be at 72° during the winter."). These may be referred to as explicit customer consumption preferences. Also, in some embodiments, OE objects 201 may have functionality for determining customer preferences through observation. For example, an OE object 201 having one or more dependent load objects 220, 222 may observe the load objects 220, 222, noting customer usage patterns relative to factors such as, weather conditions, date, time of day, etc. These may be referred to as implicit customer consumption preferences. In various embodiments, net energy, power, and capacitance requirements to meet the customer's preferences may also be stored, and provided to the appropriate OE object 201.

According to various embodiments, customer location and/or activity may be utilized to determine the customer preferences and/or net demand associated with one or more load objects (e.g., demand-side objects). A single customer may be associated with multiple load objects. For example, a customer may prefer different thermostat settings when the customer is at home versus when the customer is away. Also, if a customer is away from home and using a device with a battery that must be recharged, the customer may prefer to recharge the device when he or she arrives home, indicating increased load in the near future. In various embodiments, the OE object 201 may, directly or indirectly, receive information about a customer's location and activities. For example, the customer may carry a mobile device that reports the customer's location, such as a cell phone, GPS, tablet computer, etc. The mobile device may communicate, directly or indirectly, with an OE object 201 utilizing any suitable communication protocol including, for example, cellular protocols such as 4G, peer-to-peer protocols such as FLASHLINQ, WI-FI DIRECT, etc. The mobile devices may track the location of the customer using any suitable method including, for example, a Global Position System (GPS) method, a triangulation method, etc. In various embodiments, demand-side objects themselves may report customer activity. For example, an electric car, plug-in hybrid, or other vehicle including or constituting a demand-side object may communication directly or indirectly with an OE object 201.

Customer location and/or activity information may be used in conjunction with customer preferences to determine energy requirements for one or more demand-side objects. For example, customer preferences for an HVAC system may indicate a first temperature range if the customer is at home and a second temperature range if the customer is not at home. Accordingly, the preferences associated with the HVAC system may be modified based on the customer's desired home temperature and the customer's location. In some embodiments, OE objects 201, or other components, may have functionality for forecasting future energy use base on customer preferences and customer location and/or activity. For example, a customer preference may be that the customer likes his or her house to be at a certain warm temperature (e.g., 75-80°) upon arriving home when it is cold outside (e.g., below a threshold temperature). After determining that the preference applies (e.g., it is below the threshold temperature), the OE object 201 may update the schedule of net demand for the customer's HVAC system based on the customer's estimated time of arrival at home. The estimated time of arrival at home may be scheduled (e.g., the customer arrives at 5:30 p.m. on weekdays) or may be calculated automatically based on the customer's location, direction, speed, etc., which may be derived from the customer's mobile device, vehicle, etc. In another example, if the customer's mobile device, vehicle, etc. indicates that the customer is using a battery operated device which will require re-charging, the schedule of net demand for the appropriate demand-side object (e.g., the customer's home) may be updated. For example, an electric car may indicate to an OE object 201 it's remaining charge and its distance from home. From this, the OE object may derive an amount of charge that the car will require when it arrives home and an approximate time when it will arrive home. Alternately, the car may derive the required charge and timing and provide this information to the OE object 201.

OE objects 201 may also consider customer billing preferences, which may be explicit. Billing preferences may describe what sort of bill the customer would like to pay. In various embodiments, a customer's billing preferences may be tied to the amount of control over customer load objects 220, 222 that the customer is willing to cede to the utility. For example, if a customer expresses a preference for a lowest and/or most consistent bill, the customer may be required to make a threshold portion of the customer's load objects 220, 222 utility controlled. On the other hand, if the customer is willing to pay a higher or more variable bill, the customer may retain control over all of its load objects 220, 222 (e.g., the customer's load objects may all remain customer controlled load objects 222). Various gradations between these two scenarios may also be available. According to various embodiments, the customer may retain the ability to override an instruction from an OE object 201. For example, if an OE object 201 instructs the customer's thermostat to rise to 75° in the month of July, the customer may override and set the thermostat back to 72°. This may cause the OE objects 201 to re-balance and may also cause the customer's periodic bill to be higher than otherwise forecast. By choosing to override the OE object 201, and the previously selected customer billing preferences, the customer may be essentially retaining control over all of its load objects. According to various embodiments, an override command from a customer may be permanent or temporary. For example, an override command may be effective for a predetermined time period (e.g., 6 hours, one day, etc.). In some embodiments, an override command from a customer may be effective until the next auction is schedule to allocate grid resources to the customer.

In addition to customer preferences, the OE objects 201 may consider utility preferences. Like customer preferences, utility preferences may be both explicit and implicit. Implicit utility preferences may be determined through price observation by a monitoring OE object 201. For example, the OE object 201 may receive information describing the net energy, power and capacitance that may be provided and/or transmitted by each dependent generation object 212, transmission object 214, distribution object 216, or other utility controlled grid object as well as, for example, a cost to operate each object (e.g., total cost, marginal cost, etc.). The OE object 201 may monitor its dependent grid objects to determine their current state and, therefore, the cost of current and marginal energy, power and/or capacitance provided by the objects. Comparing the cost to the price at which the energy, power and/or capacitance may be sold to a customer may allow the OE object 201 to schedule resources appropriate based on economic signals. For example, the cost of providing electricity to a customer may be referred to as an avoided cost plus a transmission cost. The avoided cost plus transmission cost changes frequently, sometimes instantaneously, based on many factors. The rate-schedule charged to customers, however, often does not change as quickly as the avoided cost plus transmission cost. When differences exist between the avoided cost plus transmission cost and the rate scheduled charged to consumers, optimization may be done using customer permission, as expressed by billing preferences, to control end-use devices, for example, by minimizing any gap between the rate and the avoided cost plus transmission cost at any given time. Also, in some embodiments, when avoided cost plus transmission cost is greater than the scheduled rate, customer usage is minimized. On the other hand, in some embodiments, when avoided cost plus transmission cost is less than the schedule rate, customer usage may not be minimized (e.g., except to stay within customer billing preferences).

Explicit utility preferences may be received directly by one or more of the OE objects 201 and may, for example, define which party's preferences control the calculations of the OE objects 201. For example, an explicit utility preference may include an indication of an anomalous grid event, such as a particular transmission line being taken out of service for a given time period, or a recovery from an outage indicating a need for a cold-load pick-up scheme, (e.g., a staggered pick-up of the load to prevent damage to the supply-side equipment). Also, an explicit utility preference may be to avoid negative grid conditions (e.g., brown-outs, black-outs). For example, if the utility is experiencing peak demand and must curtail customer load in order to avoid a brown-out, the various OE objects 201 may receive this preference information and adjust optimizations accordingly. For example, in such a situation, the utility's resources may be prioritized to allow the OE objects 201 to shed load, perform limited outages, and/or manage outage recovery in an optimal manner. Another example utility preference may be related to phase. For example, the utility preference may indicate a desire to balance load objects across all three phases of distribution lines. In some embodiments, the utility may also help customers lower their bills by participating in Independent System Operator (ISO)/Regional Transmission Organization (RTO) markets, for example using strategies such as frequency regulation or arbitrage.

Figure 3:
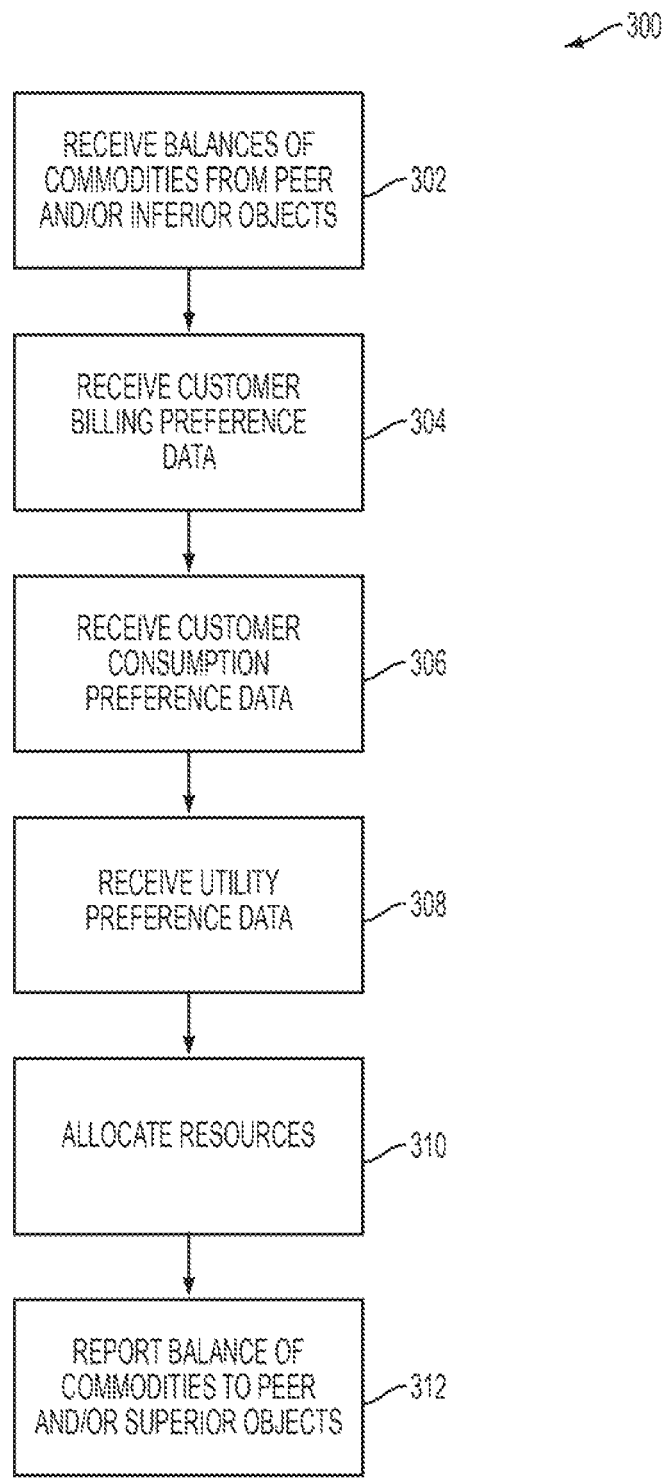
FIG. 3 illustrates one embodiment of a process flow illustrating a process that may be implemented by an optimization engine object to optimize its dependent objects.

Each OE object 201 may determine an optimal configuration of its dependent objects given its inputs. FIG. 3 illustrates one embodiment of a process flow 300 illustrating a process that may be implemented by any of the OE objects 201 to optimize its dependent objects. The process flow 300 may be referred to herein as an auction. It will be appreciated, however, that the process flow 300 may be implemented, as described, using any suitable optimization algorithm, including auction-based and non-auction-based algorithms.

At 302, the OE object 201 may receive schedules of net resource and/or demands from its dependent objects. From dependent objects that are also OE objects, the OE object may receive a schedule of net resources and/or demands indicating a balance or imbalance of commodities from the dependent OE object's own optimization calculations. In various embodiments, the dependent OE object's own optimization calculations may have been generated, according to the process flow 300, in response to an instruction from the OE object 201. From dependent objects that are non-OE objects (e.g., customer or utility controlled generation, transmission and/or load objects) the OE object 201 may receive a schedule of net resources from generation and transmission objects and a schedule of net demand from load objects. A schedule of net resources may indicate the energy, power and/or capacitance production or transmission capability of the generation or transmission object. A schedule of net demands may indicate the energy, power and/or capacitance consumption required by load objects. According to various embodiments, the OE object 201 may also receive from each object a degree to which net resources and/or demands are modifiable by the OE object 201.

At 304, the OE object 201 may receive customer billing preference data, for example, as described herein. Customer consumption preference data may received (e.g., explicit customer preference data) and/or derived (e.g., implicit customer preference data) at 306. Utility preference data may be received (e.g., explicit utility preference data) and/or derived (e.g. implicit utility preference data) at 308. It will be appreciated that, in some embodiments, the OE object 201 may receive implicit customer and/or utility preference data that has been derived by another component or device (e.g., another OE object 201, another computer device, etc.).

At 310, the OE object 201 may optimize the resources and demand of its dependent objects considering the customer and utility preferences. According to various embodiments, the optimal solution may be determined considering the prices of resources provided (e.g., energy, power capacitance, etc.). Prices may be used to convert the amount of electricity available (demand) or provided (supply) into a financial result that can be compared and prioritized. Any suitable pricing scheme may be utilized. For example, in some embodiments, electricity may be priced at a flat rate per kilowatt-hour (kWh). In these embodiments, energy and capacitance may not be considered in determining price. However, the OE object 201 may consider energy and capacitance generation capacity and expense in determining an optimal allocation. For example, a solution that requires the utility to provide electricity at a price per kWh that does not cover its costs in generating the associated power, energy and/or capacitance may not be considered optimal. In other embodiments, each dimension of generated electricity (e.g., energy, power and capacitance) may have a separate price. Temporal pricing may also be used. For example, different quantities may have different prices at different times. Also, it will be appreciated that, in some embodiments, different prices may be assigned to different generation objects 212, 218 (e.g., depending on the respective costs of production). Also, for example, if a portion of the grid 100 is about to "island," the logical-equivalent for the OE object 201 may detect the change in power grid using updated GIS information and allow the new "island" to have different pricing than the grid 100 as a whole. Pricing data may be provided to each OE object 201, for example, by the utility, by an independent system operator (ISO) and/or by a customer. For example, each party may set prices for resources under its control. It will be appreciated that any other suitable pricing scheme may be utilized by the various OE objects during optimization including, for example, embedded cost time of use (TOU) rates, system-wide day-ahead hourly price schedules, zonal location-based-marginal pricing (LBMP).

The optimization may be calculated, at 310, according to any suitable optimization method or algorithm including, for example, auction and/or game theory-based algorithms, regression analysis, or option theory. Optimization algorithms may also utilize combinatorial optimization, dynamic programming, evolutionary algorithms, stochastic optimization, neural networks, fuzzy logic, some combination of the above, etc. Also, it will be appreciated that the optimal solution for any given set of dependent objects may include control commands issued by the OE object 201 to its dependent objects to activate, deactivate and/or modify the operation of utility-controlled objects. For example, a generation object 212 may be activated, deactivated, and or its generation level may be changed. Also, for example, a utility-controlled load object, such as a customer air conditioner may be turned on, turned off or have its operating state changes (e.g., by changing a thermostat setting). Control commands may be provided directly to a utility-controlled object. In some embodiments, control commands may be provided to a dependent OE object 201. Such a dependent OE object 201 may then re-execute the process flow 300 in view of the control commands. After determining the optimization and issuing and/or scheduling implementing control commands, each OE object 201 may report its resulting balance or imbalance of commodities to a peer and/or superior OE object. It will be appreciated that the highest OE object 201 in the hierarchy 200 cannot report an imbalance of commodities. Also, for example, if the highest OE object 201 in the hierarchy 200 has an imbalance of commodities, some or all of the OE objects 201 may re-execute the process flow 300 to determine optimal settings in view of the overall lack of balance. This process may be repeated throughout the system until a satisfactory optimization level is reached. In some embodiments, a satisfactory optimization level may indicate match between all generated and consumed resources.

According to various embodiments, each OE object 201 may execute the process flow 300 according to any temporal interval. For example, each OE object 201 may repeatedly and continuously execute the process flow 300, each time with the most recent information. Also, in some embodiments, each OE object 201 may execute the process flow 300 periodically (e.g., every day, every hour, every ten minutes, etc.). In various embodiments, where the process flow 300 is calculated periodically, control commands resulting from optimization may be scheduled for a future time (e.g., the deactivation of a particular generation object 212 may be scheduled at a certain time and/or when load drops below a certain value).

Figure 4:
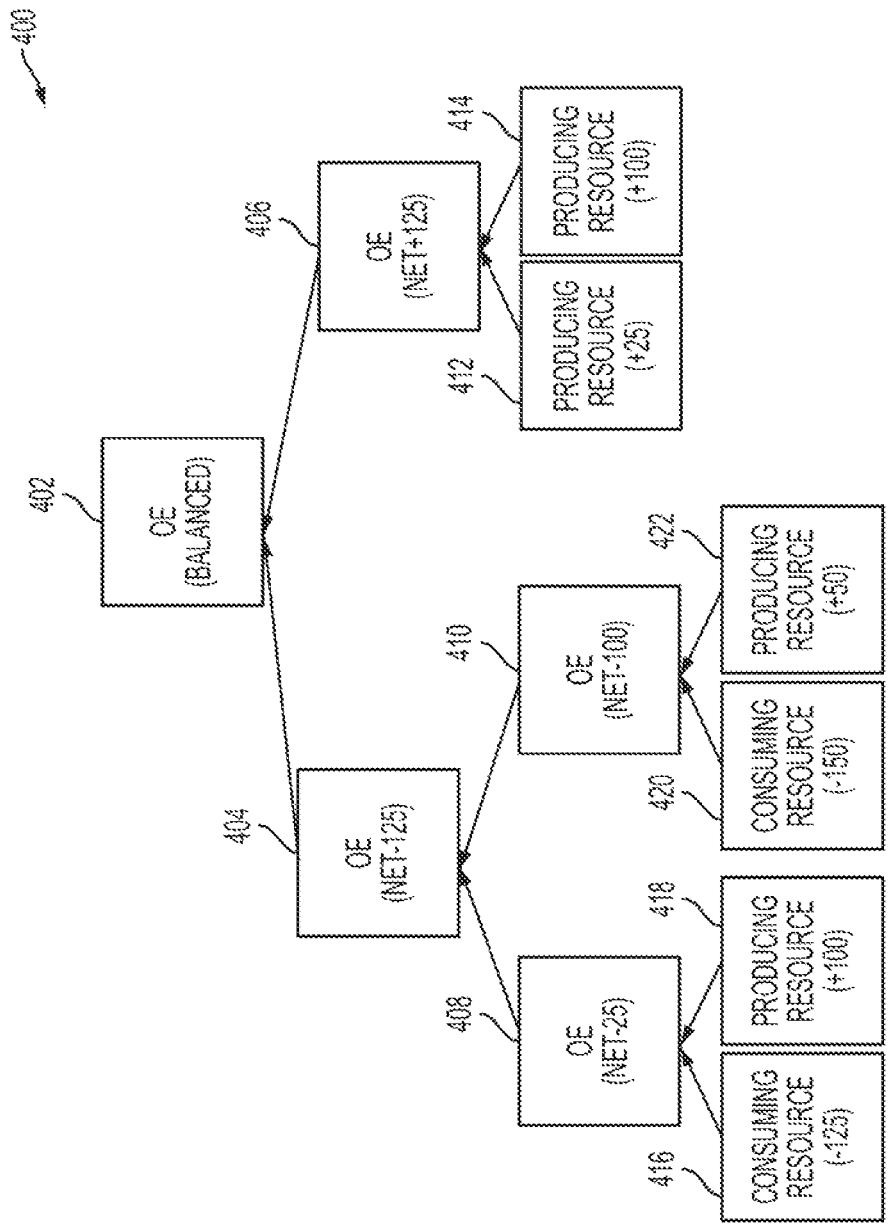
FIG. 4 illustrates one embodiment of a logical hierarchy of grid objects illustrating the inheritance of balances of commodities.

After executing the process flow 300 an individual OE object 201 may be balanced, may have a negative imbalance of commodities (e.g., it needs additional supply) or may have a positive imbalance of commodities (e.g., it can provide additional supply). To balance the complete hierarchy 200 or electric grid 100, a positive or negative imbalance of commodities may be inherited by locally-connected superior and peer OE objects 201 that may be able to fulfill the need or purchase the available commodity. For example, FIG. 4 illustrates one embodiment of a logical hierarchy of grid objects illustrating the inheritance of balances of commodities. As illustrated, an OE object 408 comprises a dependent load or demand-side object 416 and a dependent generation or supply-side object 418. The supply-side object 418 generates one hundred (100) units, while the demand-side object consumes one-hundred-twenty-five (125) units. Accordingly, the imbalance of commodities at the OE object 408 is negative twenty-five (−25) units. An OE object 410 comprises a dependent consuming object 420 and a dependent producing object 422. The imbalance of commodities at the OE object 410 is negative one-hundred (−100) units. In various embodiments, the OE engines 408 and 410 may report their imbalances of commodities to the OE object 404, from which 408 and 410 depend. OE engine 404 may then optimize the results of the OE objects 408, 410, resulting in an imbalance of commodities at the OE objection 404 of negative one-hundred-twenty-five (−125). Likewise, an OE object 406 may have an imbalance of commodities of positive one-hundred-twenty-five (125). OE objects 406 and 404 may both depend on OE object 402, which may optimize the outputs of the OE objects 404, 406, resulting in balance.

According to various embodiments, dependencies between OE objects may be determined on-the-fly based on communications and/or transmission costs. For example, a local OE object having a positive or negative imbalance of commodities may communicate that balance to other local OE objects including, for example, those at a higher level in an object hierarchy. The cost to communicate resources between non-OE objects may be considered as an aspect of the commodity value (or cost). Communications costs to transfer data between OE objects may also be considered. Each OE object may determine whether to 'invite' other engines to participate in a local auction (implementation of the process flow 300), if participation is not cost prohibitive. Also, according to various embodiments, less than all of the objects directly or indirectly depending from an OE object may take place in an auction 300 implemented by the OE object. For example, if communication or transmission costs associated with a particular dependent object are too high, the dependent object may be omitted from consideration.

Figure 5:
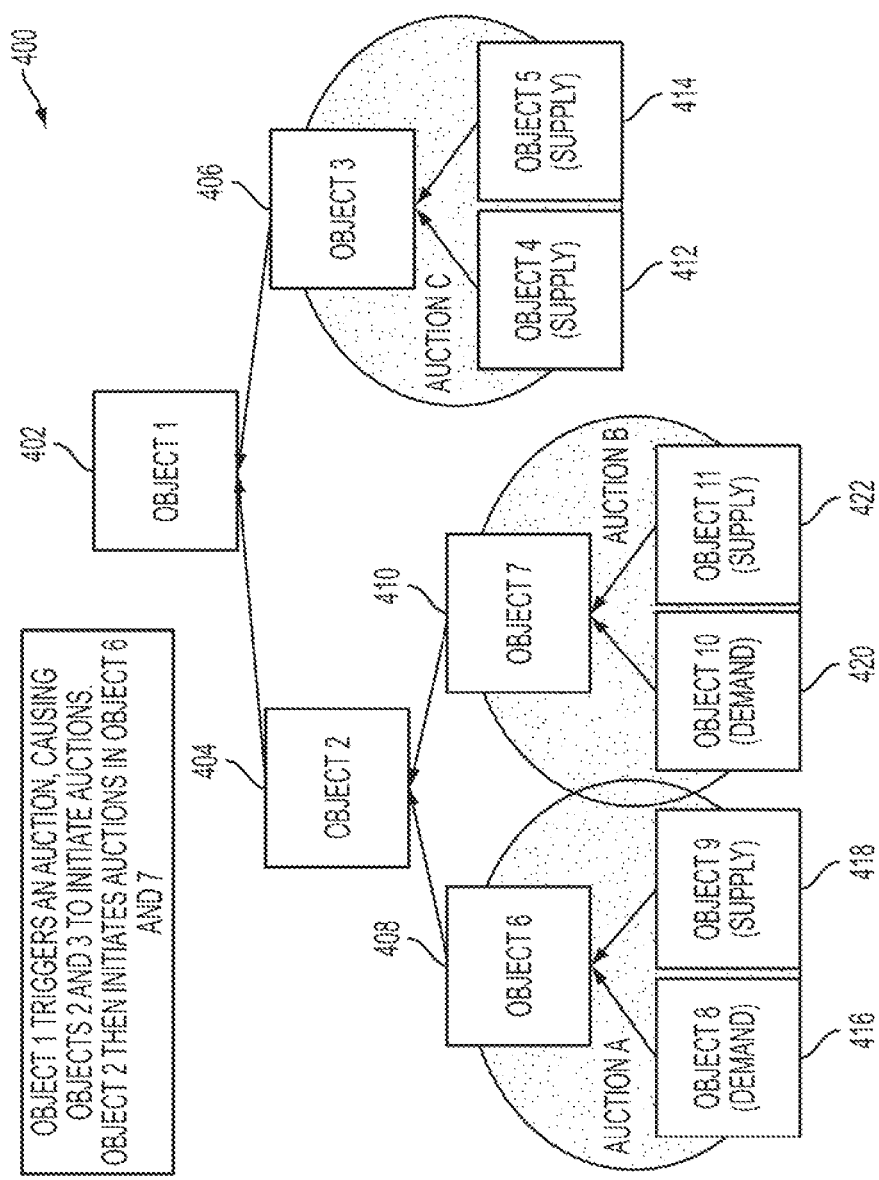
FIGS. 5-7 illustrate an example optimization inheritance based on the object hierarchy of FIG. 4.
Figure 6:
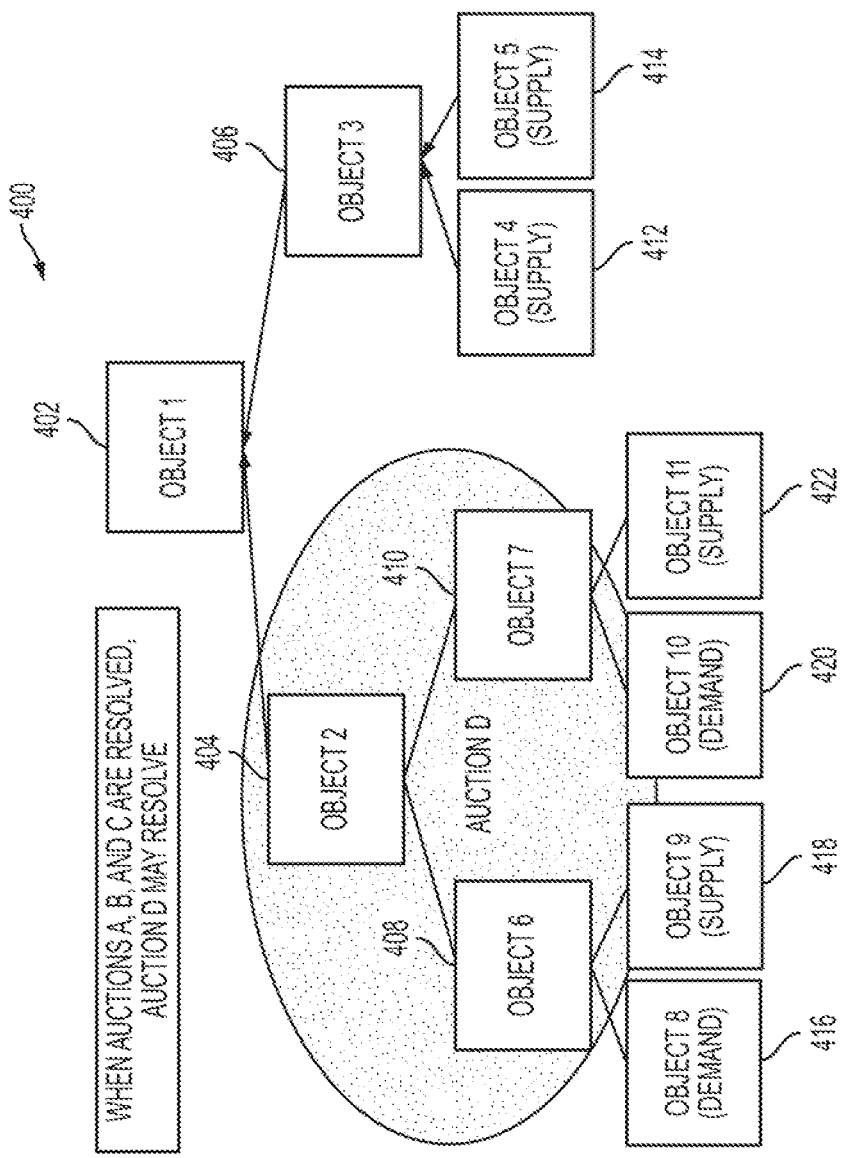
Figure 7:
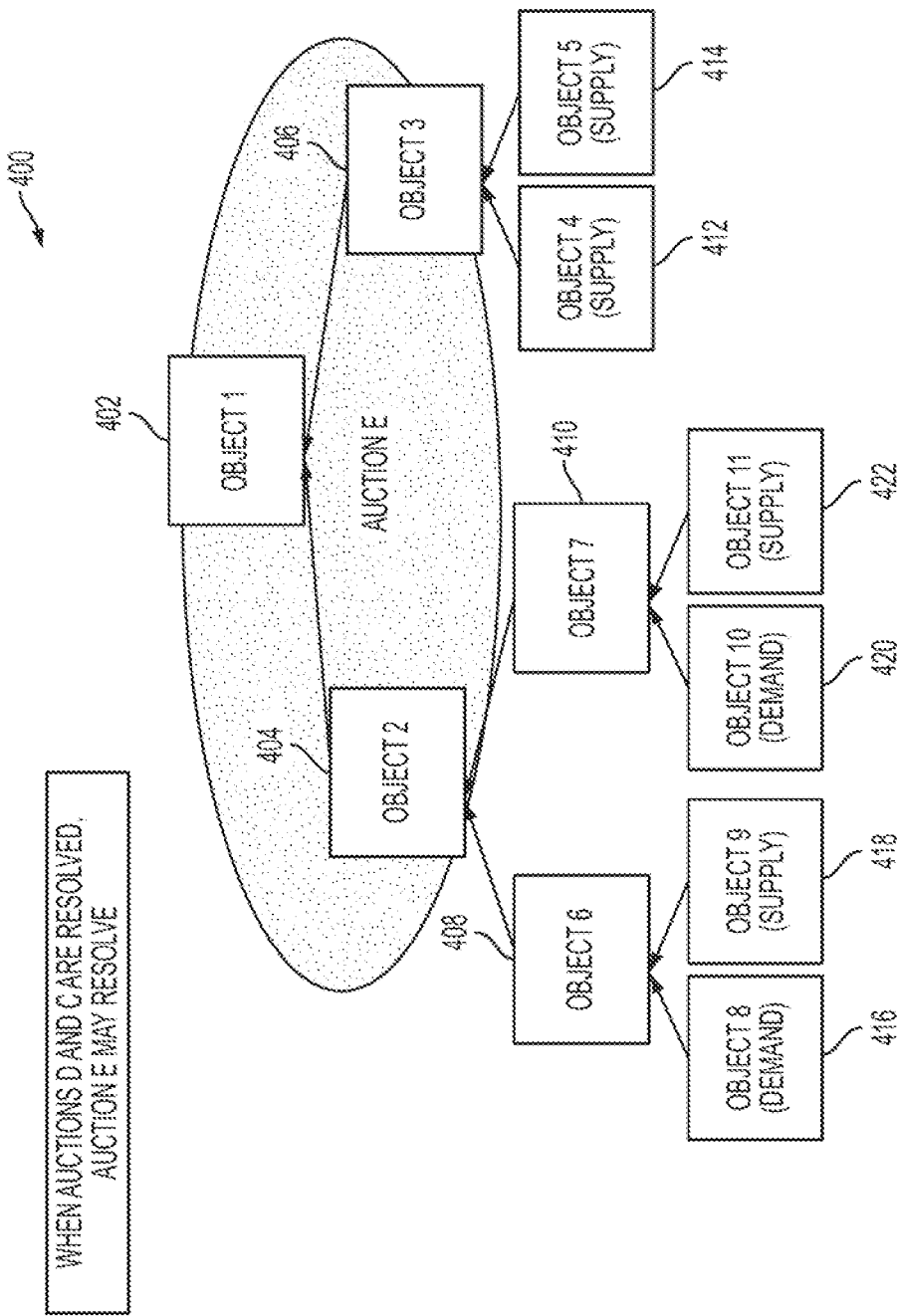

FIGS. 5-7 illustrate an example optimization inheritance based on the object hierarchy 400. For example, instances of the auction process flow 300 may be executed by various OE objects 402, 404, 406, 408, 410, as described herein to find optimal solutions for the respective dependent objects. Results from the various OE objects may be inherited through the system until the grid 100 as a whole is optimized. Accordingly, in various embodiments, the OE objects may be programmed to implement procedures regarding which objects may create or call an auction 300 with other objects, which objects may participate in the auction 300, what resources are included in the auction 300, and how the auction solves (e.g., which algorithm is used at 310).

According to various embodiments, any OE object may call an auction involving inferior objects (e.g., objects directly or indirectly dependent on the calling OE object). An OE object may not be able to call an auction involving superior objects (e.g., objects that the calling OE object depends on directly or indirectly). In various embodiments, the OE object calling an auction may determine the time frame of the resources to be auctioned (e.g., one hour, one day, etc.), sum all supply-side resources available (including price offered for these resources), calculate the total demand side need (including the prices willing to be paid for the resources), and run the auction subject to all participant constraints. For example, the requesting OE object may implement the auction process flow 300.

Although an OE object may implement an auction 300 involving any object directly or indirectly depending from the OE object, in various embodiments, auction participation may be limited to object that are one step removed and below the calling OE object on the object hierarchy (i.e., objects that directly depend on the calling object). Accordingly, auctions may be implemented as a cascading set of events pushed down to inferior objects and triggered by a superior object. When the inferior objects are OE objects, the cascading set of events pushed down may result in a corresponding set of commodities balances and preferences pushed back up. This process may be repeated throughout the system until a satisfactory optimization level is reached.

According to various embodiments, objects called to an auction must be physically interconnected on the grid or in a customer's premise at the time of command execution (e.g., during implementation of the power or energy reduction). In some embodiments, objects called to auction may or may not be physically connected to the grid during the auction. For example, an electric vehicle may be on its way home while an auction for energy needed to charge it in the next hour is taking place including the OE engine 201 residing at a home location for the vehicle). As described above, individual auctions 300 below the root auction 402 need not balance. Accordingly, an auction may comprise only sellers (e.g., supply or utility objects) only buyers (e.g., customer or load objects), or some combination of both. Sellers may provide different kinds of resources (e.g., energy, power, or capacitance). As described above, these quantities may be priced separately or collectively. Demand provided by buyers, in various embodiments, may not be limited to the available supply. When an inferior or dependent object takes part in a valid auction, it may pass to the conducting OE object any constraints (e.g., results of the OE object's own auction). For example, demand-side objects may include preferences for determining how much load is available for control and whether the object can shed load or shift load to a future time period. Supply-side objects may include preferences that describe production limits for the time period considered by the auction.

Once all desired and/or appropriate objects have been joined to an auction, the resource needs calculated, and the constraints registered, the auction may begin (e.g., the calling OE object may optimize in view of the participating objects as at 310). If the auction cannot successfully resolve by satisfying all demand by an equal amount of supply, the excess supply or demand (e.g., an imbalance of commodities) may be pushed up to the next interconnected superior object. If there are no superior nodes to handle excess demand, and not enough resources available to satisfy the imbalance, dependent or inferior objects may be instructed to curtail demand for the resource, for example, beginning with the lowest, unconstrained bidder. If there are no superior nodes to handle excess supply and not enough demand is available to satisfy the imbalance, then supply resources may be instructed to curtail production, beginning with the most expensive, unconstrained supply source. In this way, the auction process may resolve in a recursive manner when there is an imbalance between supply and demand, successively promoting imbalance amounts to superior nodes in an effort to find matching resources to balance supply and demand.

Referring now to FIG. 5, the OE object 402 may initiate an auction and may set the time period of resources to be auctioned, which may be communicated to OE objects 404, 406, which depend on OE object 402. Because neither OE object 404 nor OE object 406 comprise supply or demand of their own, the auction instruction may be pushed down. For example, OE engine 406 may implement an auction, indicated as Auction C, considering its dependent objects 412, 414. As indicated above, the imbalance of commodities from this auction may be one-hundred-twenty-five (125) units. As illustrated, none of the objects 408, 410 comprise supply or demand of their own, so the auction instruction to OE object 404 may be pushed down to OE objects 408, 410, which may conduct Auction A and Auction B, respectively. Auction A, considering objects 416 and 418 may have an imbalance of commodities equal to negative twenty-five (−25), while Auction B, considering objects 420, 422, may have an imbalance of commodities equal to negative one-hundred (−100).

Referring now to FIG. 6, the auction instruction from OE object 402 still may not be implemented because OE object 404 has neither direct supply or demand capacity nor a net balance or imbalance of commodities. Accordingly, OE object 404 may implement Auction D, utilizing the constraints and net balances of commodities received from the Auctions A and B. The result may be a net imbalance of commodities equal to negative one-hundred-twenty-five (−125) units. At this point, the original auction instruction from OE object 402 may be implemented utilizing the inherited constraints and balances of commodities from the Auctions D and C, resulting in a balanced state at OE object 402.

It can be seen that the needs and preferences of suppliers' may be met by introducing the suppliers to objects capable of supplying their needs, either partially or collectively. According to various embodiments, however, there may be a significant difference between limiting factors of suppliers and customers. This is illustrated by FIGS. 4-7. The needs or demand of the load objects are aggregated moving from the load objects toward the generation side of the grid (e.g., the top of the hierarchy 400). On the other hand, moving from the generation side to the load side, the availability of generated commodities is dispersed.

Figure 8:
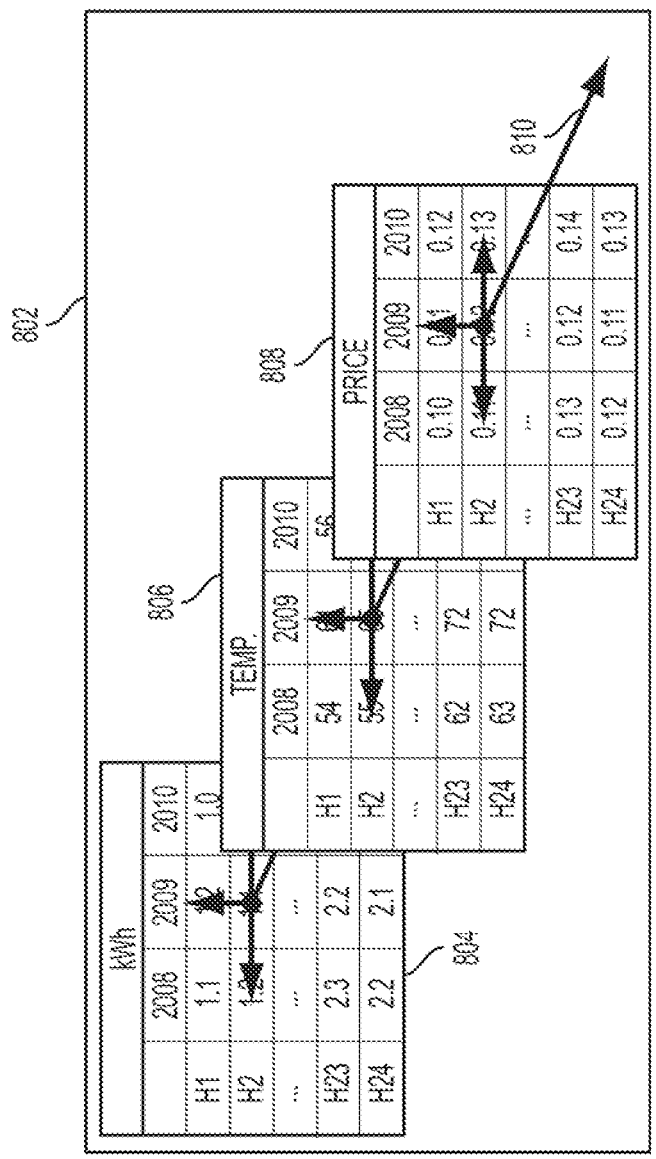
FIG. 8 illustrates a chart showing one embodiment of multi-dimensional panel data that may be utilized (e.g., by an OE object) to project future load, generation capacity and/or cost.

As described herein, certain objects may be described by past, present and projected future load, generation capacity and/or cost. According to various embodiments, projected future load, generation capacity and/or price may be determined by considering multi-dimensional panel data. For example, FIG. 8 illustrates a chart 802 showing one embodiment of multi-dimensional panel data that may be utilized (e.g., by an OE object) to project future load, generation capacity and/or cost. For example, each panel may comprise indications of historic data indicating prior factors that have the potential to affect load demand, generation capacity and/or cost. For example, panel 804 indicates kWh consumed plotted by year and object (H1, H2, etc.). Panel 806 indicates temperature plotted by year and object. Panel 808 indicates price plotted by year and object. A projected future load, generation capacity and/or cost may be found by projecting one or more of the variables indicated by panels 804, 806, 808 and finding like values in other panels having similar conditions. For example, arrow 810 indicates an example use of panel data for a January weekday for a specific residential load object (H2). Present and future values for load demand may be estimated and/or forecast based on data available for the same time one hear prior, the same time one year prior, etc. In this way, panel data tables for present and future values may be populated dynamically. Similarly, model stability may be increased by driving regression coefficients among variables used to populate the missing data and validate existing data in the panels. In various embodiments, this methodology may increase the reliability and stability of the system (e.g., using history kWh and observed temperature to determine the future object load forecast while validating the existing load.

Figure 9:
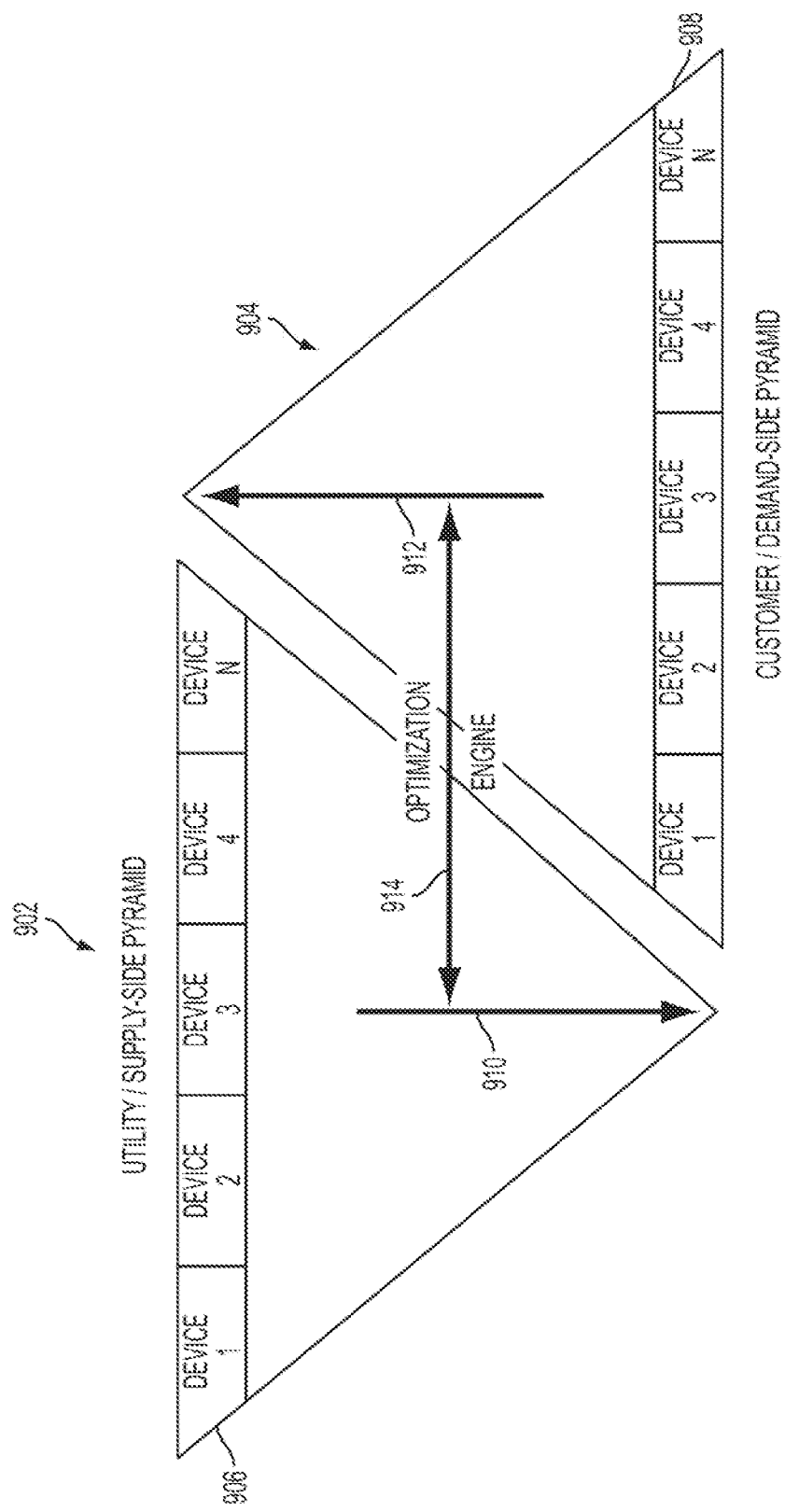
FIG. 9 is a chart illustrating one embodiment of a supply and demand side of the grid of FIG. 1 showing inheritance among different object layers.

FIG. 9 is a chart 900 illustrating one embodiment of a supply and demand side of the grid 100 showing inheritance among different object layers. Each object layer may comprise one or more OE objects programmed to monitor, analyze and optimize resources and/or goods (e.g., energy, power and capacitance) among generation objects and load objects within that layer and with other layers. For example, providing and/or receiving electricity between objects may represent inheritance between dependent OE objects, as described above. Referring to FIG. 9, customer and customer-owned devices 908 may be considered to reside in the customer pyramid 904. Customer demand may be considered to move in the direction of arrow 912. According to various embodiments, each customer device may be considered to be a separate object of its own or, alternatively, each customer 908 may represent an aggregation of the devices or objects on their premise. Some objects within each premise may be controlled by an OE object, while others may not be. The number and attributes of these devices/objects may be supplied to an OE object by the aggregated customer object. For the devices that may be controlled, the OE object may be provided with an aggregation of the controllable needs of the particular customer. The logical construct for customer aggregation of preferences and needs may be provided by the GIS system, which may populate or allow population of the customer pyramid based on how customers are, or may be, physically interconnected at each level.

The utility or supply pyramid 902 may represent utility owned or manages resources (e.g. generation, transmission and/or distribution resources). Utility needs or preferences may be considered to move in the direction of arrow 910, with optimal solutions between customer demand 912 and utility needs 910 being determined and, in some embodiments, implemented by the OE objects, represented by arrow 914. The logical structure of the utility pyramid 902 may be provided by the grid and the communications network, described above with respect to FIG. 1. For example, the grid and the communications network may be logically interconnected to provide physical constraints on the hierarchy of resources available to serve the customer pyramid 904. Both of the pyramids 902, 904 may be dynamic (e.g., the grid and communications system may be changed and updated) and multilayered (vertically as well as horizontally connected). The GIS system may provide each OE object with a list of locally connected resources and communications paths (e.g., related to dependent, or potentially dependent, objects). According to various embodiments, dependencies between different objects may be determined at least in part by the objects relative positions on the supply-side pyramid 906 or demand-side pyramid 904.

Figure 10:
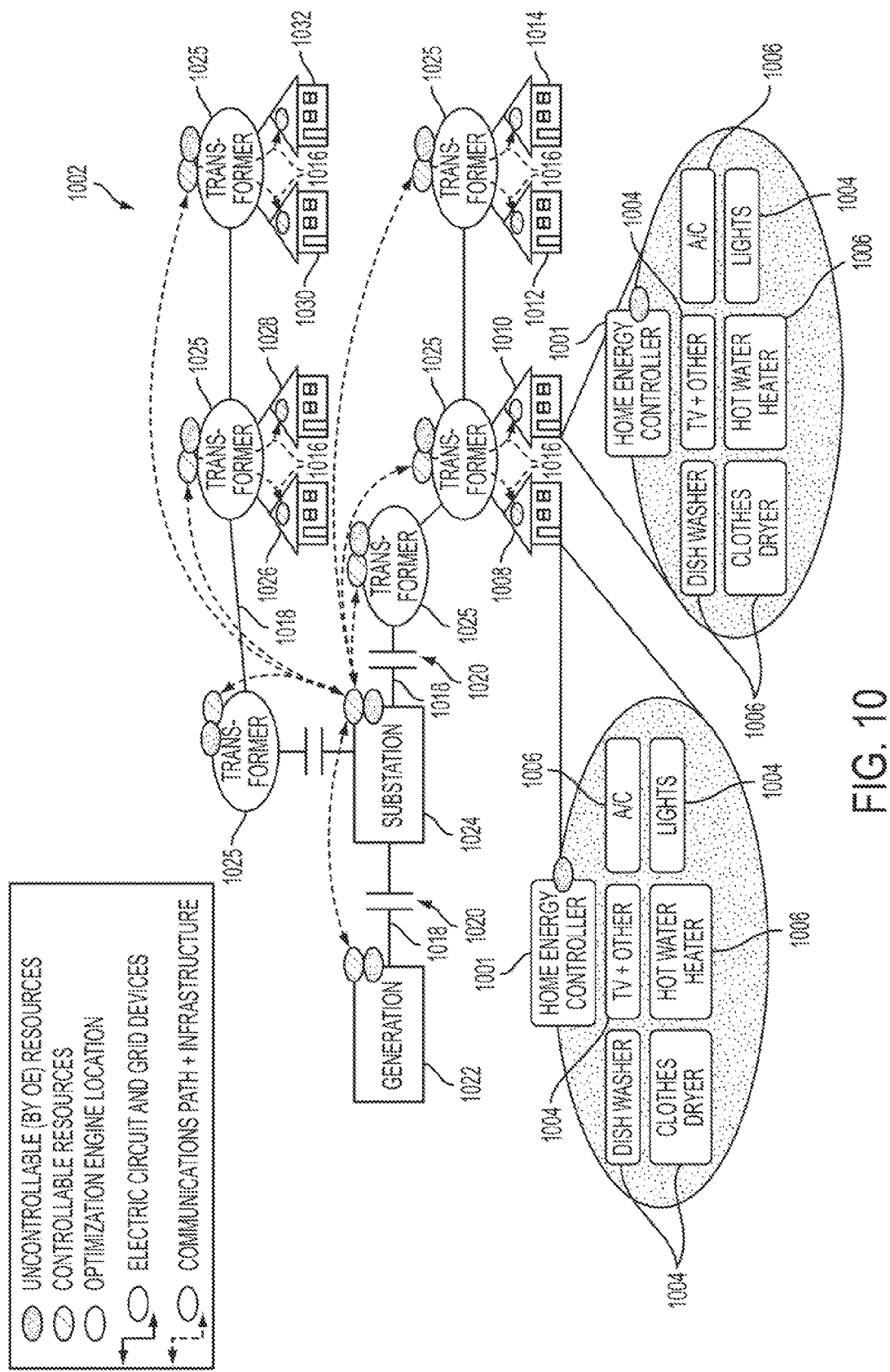
FIG. 10 is a diagram illustrating local grid and communication system connections between grid components.

FIG. 10 is a diagram 1002 illustrating local grid and communication system connections between grid components. For example, the diagram 1002 may indicate the grid as seen by a GIS system. The information shown in the diagram 1002 may be provided to an OE object with dependent objects based in whole or in part on the illustrated components. Also, for example, the communication and grid paths represented in diagram 1002 may be utilized by one or more OE objects to determine whether to hold a joint auction and/or implementation of the process flow 300 to jointly optimize grid resources. As illustrated in FIG. 10, a generation component 1022, substation component 1024 and various transformers 1025 of the grid are connected to various customer premises 1008, 1010, 1012, 1014, 1026, 1028, 1030, 1032 via lines 1018. Various switching equipment 1020 may be utilized to make and/or break connections between the generation component 1022 and the various customer premises. In the example shown in FIG. 10, individual customer appliances 110 are illustrated for premises 1008, 1010. For example, each premise 1008, 1010 comprises a home energy controller 1001 and various component including controllable components 1006 (e.g., components that may be controllable by an OE object) and non-controllable components 1004 (e.g., components that may not be controllable by an OE object). Communications network connections between the generation unit 1022, substation 1024 and various customer premises are indicated by connection lines 1016.

Figure 11:
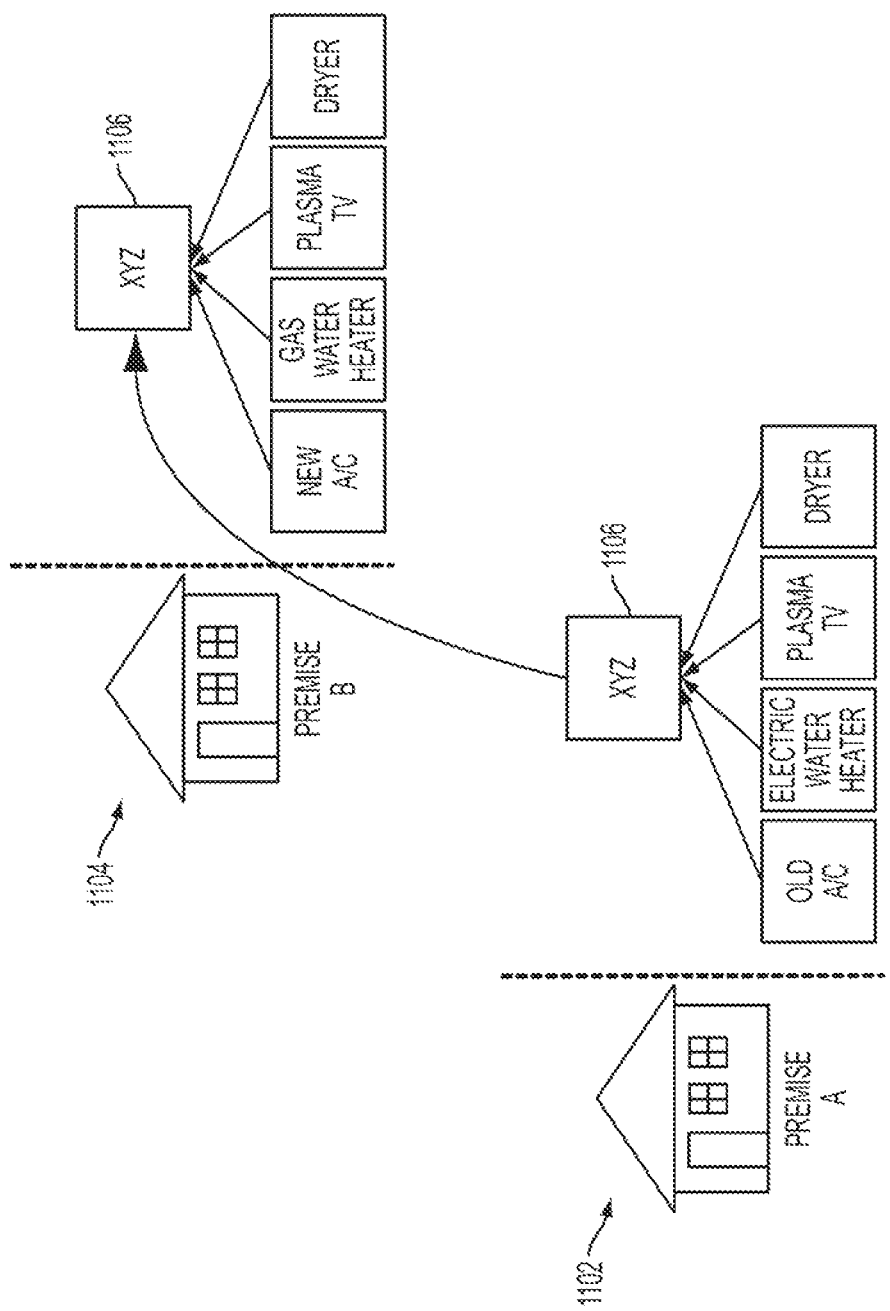
FIG. 11 illustrates one embodiment of a pair of premises showing object inheritance between premises.

As described herein, the OE objects may comprise inheritance features allowing the OE objects to determine inheritance functionality for sensing the state of other objects connected thereto. FIG. 11 illustrates one embodiment of a pair of premises 1102, 1104 showing object inheritance between premises. For example, a customer may move from the premise 1102 to the premise 1104. The properties of the customer's appliances may retained by the assigned OE object. A home energy controller HEC 1106 at one or both of the premises 1102 may update the assigned OE object of appliance changes. For example, relative to the premise 1102, the premise 1104 may have a new air conditioner and a gas rather than electric water heater. Similarly, if the customer makes appliance changes at a single premise, these changes may be communicated to the assigned OE object (e.g., via an HEC).

According to various embodiments, parameters of auctions initiated by the OE engines may be modified based on conditions of the grid 100. For example, the grid 100 may experience intentional or unintentional anomalous conditions. An example of an intentional anomalous condition may be a scheduled shut-down of a generation or transmission object. An example of an unintentional anomalous condition may be an equipment failure or natural accident (e.g., storm) that causes a failure in a piece of generation, transmission or distribution equipment. In various embodiments, when an anomalous condition occurs, each OE engine may be instructed to switch control of auctions to demand-side objects. For example, in such a circumstance, supply-side objects may not be permitted to call an auction. This may ensure that utility preferences are granted priority over customer preferences. This may be desirable, for example, when, due to a shut-down or failure granting customer preferences as usual may cause a brown-out or black out. In another example, if a portion of the grid has suffered an outage, it may not be desirable to restore power to the entire portion of the grid simultaneously, as this may put a dangerous load on supply-side equipment. Accordingly, during a restoration event, auction initiation may be limited to supply-side objects to ensure that power is restored smoothly. This may be referred to as a cold-load pick-up scheme.

According to various embodiments, the OE objects may be implemented in a form that is executable on many different kinds of hardware, operating systems, etc. For example, OE objects may be implemented by any type of computing device including, for example, a server, a router, a mobile computing device (e.g., mobile phone, palmtop computer, netbook, etc.). Also, in various embodiments, the OE objects described herein may be designed to be flexible and agnostic to different pricing and/or optimization schemes. For example, the OE objects themselves may serve as a platform, allowing other applications to operate on top, similar to the operating system of a computer. In another example, utility preferences may be modified to implement many different cold-load pick-up schemes. Any other suitable form of application may be implemented in conjunction with the OE objects. For example, a measurement and verification scheme may be implemented to monitor energy efficiency efforts. Applications such as these and others may be easily added or removed from the platform (e.g., from each OE object) in a plug-and-play fashion. Also, in various embodiments, the OE objects may be agnostic as to the actual algorithms chosen for pricing, forecasting, prioritization or optimization. In various embodiments, different utilities may implement the OE objects using, or not using, which ever algorithms the utilities determine.

According to various embodiments, the systems and methods described herein may also be implemented to achieve certain security-related advantages. For example, security of the system may be established using the electric grid hierarchy and customer preference. Thus, only objects at a superior level (e.g. closer to generation) on the utility-side may be allowed to aggregate properties. Similarly, only devices which are available for OE object control maybe aggregated on the customer-side. Additionally, OE objects may partition the methods of each superior object from an inferior object, avoiding inheritance of information where disallowed.

The examples presented herein are intended to illustrate potential and specific implementations of the present invention. It can be appreciated that the examples are intended primarily for purposes of illustration of the invention for those skilled in the art. No particular aspect or aspects of the examples are necessarily intended to limit the scope of the present invention. For example, no particular aspect or aspects of the examples of system architectures, methods or processing structures described herein are necessarily intended to limit the scope of the invention. Also, while specific optimization algorithms and inheritance procedures are described herein, it will be appreciated that the applications provided according to the description herein may include other optimizations and inheritance procedures as well.

It is to be understood that the figures and descriptions of the present invention have been simplified to illustrate elements that are relevant for a clear understanding of the present invention, while eliminating, for purposes of clarity, other elements. Those of ordinary skill in the art will recognize, however, that these sorts of focused descriptions would not facilitate a better understanding of the present invention, and therefore, a more detailed description of such elements is not provided herein.

Moreover, the processes associated with the present example embodiments (e.g., optimization engines and other objects) may be executed by programmable equipment, such as computers. Software or other sets of instructions may be employed to cause programmable equipment to execute the processes. The processes may be stored in any storage device, such as, for example, a computer system (non-volatile) memory, an optical disk, magnetic tape, or magnetic disk. Furthermore, some of the processes may be programmed when the computer system is manufactured or via a computer-readable memory medium.

It can also be appreciated that certain process aspects described herein may be performed using instructions stored on a computer-readable memory medium or media that direct a computer or computer system to perform process steps. A computer-readable medium may include, for example, any non-transitory media such as, for example, memory devices such as diskettes, compact discs of both read-only and read/write varieties, optical disk drives, and hard disk drives. A computer-readable medium may also include memory storage that may be physical, virtual, permanent, temporary, semi-permanent and/or semi-temporary. It will be appreciated that the term non-transitory refers to the medium and not to any data stored thereon. For example, a random access memory (RAM) is non-transitory, although the data stored thereon may change regularly.

A "computer," "machine," "computer device," "host," "engine," or "processor" may be, for example and without limitation, a processor, microcomputer, minicomputer, server, mainframe, laptop, personal data assistant (PDA), wireless e-mail device, cellular phone, pager, processor, fax machine, scanner, or any other programmable device configured to transmit and/or receive data over a network. Computer systems and computer-based devices disclosed herein may include memory for storing certain software applications used in obtaining, processing, and communicating information. It can be appreciated that such memory may be internal or external with respect to operation of the disclosed example embodiments. The memory may also include any means for storing software, including a hard disk, an optical disk, floppy disk, ROM (read only memory), RAM (random access memory), PROM (programmable ROM), EEPROM (electrically erasable PROM) and/or other computer-readable memory media.

In various example embodiments of the present invention, a single component may be replaced by multiple components, and multiple components may be replaced by a single component, to perform a given function or functions. Except where such substitution would not be operative to practice embodiments of the present invention, such substitution is within the scope of the present invention. Any of the servers or computer systems described herein, for example, may be replaced by a "server farm" or other grouping of networked servers (e.g., a group of server blades) that are located and configured for cooperative functions. It can be appreciated that a server farm may serve to distribute workload between/among individual components of the farm and may expedite computing processes by harnessing the collective and cooperative power of multiple servers. Such server farms may employ load-balancing software that accomplishes tasks such as, for example, tracking demand for processing power from different machines, prioritizing and scheduling tasks based on network demand, and/or providing backup contingency in the event of component failure or reduction in operability.

Various example embodiments of the systems and methods described herein may employ one or more electronic computer networks to promote communication among different components, transfer data, or to share resources and information. Such computer networks can be classified according to the hardware and software technology that is used to interconnect the devices in the network, such as optical fiber, Ethernet, wireless LAN, HomePNA, power line communication or G.hn. The computer networks may also be embodied as one or more of the following types of networks: local area network (LAN); metropolitan area network (MAN); wide area network (WAN); virtual private network (VPN); storage area network (SAN); or global area network (GAN), among other network varieties.

For example, a WAN computer network may cover a broad area by linking communications across metropolitan, regional, or national boundaries. The network may use routers and/or public communication links. One type of data communication network may cover a relatively broad geographic area (e.g., city-to-city or country-to-country) which uses transmission facilities provided by common carriers, such as telephone service providers. In another example, a GAN computer network may support mobile communications across multiple wireless LANs or satellite networks. In another example, a VPN computer network may include links between nodes carried by open connections or virtual circuits in another network (e.g., the Internet) instead of by physical wires. The link-layer protocols of the VPN can be tunneled through the other network. One VPN application can promote secure communications through the Internet. The VPN can also be used to separately and securely conduct the traffic of different user communities over an underlying network. The VPN may provide users with the virtual experience of accessing the network through an IP address location other than the actual IP address which connects the access device to the network.

Computer networks may include hardware elements to interconnect network nodes, such as network interface cards (NICs) or Ethernet cards, repeaters, bridges, hubs, switches, routers, and other like components. Such elements may be physically wired for communication and/or data connections may be provided with microwave links (e.g., IEEE 802.12) or fiber optics, for example. A network card, network adapter or NIC can be designed to allow computers to communicate over the computer network by providing physical access to a network and an addressing system through the use of MAC addresses, for example. A repeater can be embodied as an electronic device that receives and retransmits a communicated signal at a boosted power level to allow the signal to cover a telecommunication distance with reduced degradation. A network bridge can be configured to connect multiple network segments at the data link layer of a computer network while learning which addresses can be reached through which specific ports of the network. In the network, the bridge may associate a port with an address and then send traffic for that address only to that port. In various example embodiments, local bridges may be employed to directly connect local area networks (LANs); remote bridges can be used to create a wide area network (WAN) link between LANs; and/or, wireless bridges can be used to connect LANs and/or to connect remote stations to LANs.

In various example embodiments, a hub may be employed which contains multiple ports. For example, when a data packet arrives at one port of a hub, the packet can be copied unmodified to all ports of the hub for transmission. A network switch or other devices that forward and filter OSI layer 2 datagrams between ports based on MAC addresses in data packets can also be used. A switch can possess multiple ports, such that most of the network is connected directly to the switch, or another switch that is, in turn, connected to a switch. The term "switch" can also include routers and bridges, as well as other devices that distribute data traffic by application content (e.g., a Web URL identifier). Switches may operate at one or more OSI model layers, including physical, data link, network, or transport (i.e., end-to-end). A device that operates simultaneously at more than one of these layers can be considered a multilayer switch. In certain example embodiments, routers or other like networking devices may be used to forward data packets between networks using headers and forwarding tables to determine an optimum path through which to transmit the packets.

As employed herein, an application server may be a server that hosts an API, to expose business logic and business processes for use by other applications. Examples of application servers include J2EE or Java EE 5 application servers including WebSphere Application Server. Other examples include WebSphere Application Server Community Edition (IBM), Sybase Enterprise Application Server (Sybase Inc), WebLogic Server (BEA), JBoss (Red Hat), JRun (Adobe Systems), Apache Geronimo (Apache Software Foundation), Oracle OC4J (Oracle Corporation), Sun Java System Application Server (Sun Microsystems), and SAP Netweaver AS (ABAP/Java). Also, application servers may be provided in accordance with the .NET framework, including the Windows Communication Foundation, .NET Remoting, ADO-.NET, and ASP.NET among several other components. For example, a Java Server Page (JSP) is a servlet that executes in a web container which is functionally equivalent to CGI scripts. JSPs can be used to create HTML pages by embedding references to the server logic within the page. The application servers may mainly serve web-based applications, while other servers can perform as session initiation protocol servers, for instance, or work with telephony networks. Specifications for enterprise application integration and service-oriented architecture can be designed to connect many different computer network elements. Such specifications include Business Application Programming Interface, Web Services Interoperability, and Java EE Connector Architecture.

While various example embodiments of the invention have been described herein, it should be apparent, however, that various modifications, alterations and adaptations to those embodiments may occur to persons skilled in the art with the attainment of some or all of the advantages of the present invention. The disclosed example embodiments are therefore intended to include all such modifications, alterations and adaptations without departing from the scope and spirit of the present invention as set forth in the appended claims.

We claim:

1. A computer-implemented system for optimizing energy usage, the system comprising:
a computer system comprising at least one processor and operatively associated memory, the computer system programmed to execute an optimization engine object, wherein the optimization engine object is in communication with a plurality of dependent objects comprising at least one of:
a dependent optimization engine object; and
at least one of a dependent supply-side object to generate energy and a dependent demand-side object to use energy;
wherein the optimization object is programmed to:
receive dependent object attribute data from each of the at least one dependent objects, wherein the dependent object attribute data for each dependent object of the optimization engine comprises, for a first time period:
at least one attribute selected from the group consisting of: a schedule of net resources indicating supply-side capacity of the dependent object; and a schedule of net demand indicating demand-side usage of the dependent object; and
preference data indicating usage preferences associated with the dependent object;
determine an optimal configuration for the plurality of dependent objects over the first time period subject to at least one optimization constraint, wherein determining the optimal configuration comprises determining a net energy usage of the plurality of dependent objects;
conditioned upon the optimization engine depending from a superior optimization engine, transmit the net energy usage to the superior optimization engine.

2. The system of claim 1, wherein each optimization engine is further programmed to issue a control command to a first object selected from the plurality of dependent objects.

3. The system of claim 2, wherein the first object is a supply-side object, and wherein the control command instructs the first object to modify a property of energy generated by the supply-object.

4. The system of claim 2, wherein, when the first object is a demand-side object, and wherein the control command instructs the first object to reduce its energy consumption.

5. The system of claim 2, wherein the first object is a dependent optimization engine object and the control command instructs the dependent optimization engine to determine a new optimal configuration for at least one dependent object of the dependent optimization engine subject to at least one new optimization constraint.

6. The system of claim 1, wherein the optimization engine is also programmed to select the plurality of dependent objects from a plurality of potential dependent objects based on at least one factor selected from the group consisting of:
a physical proximity between each of the plurality of potential dependent objects and the computer system;
a proximity between each of the plurality of potential dependent objects and the computer system on an energy grid; and
a relative proximity of the computer system and the at least one dependent object to at least one of a supply-side object and a demand-side object.

7. The system of claim 1, wherein the at least one optimization constraint comprises a minimum difference between a price charged for energy provided to the demand-side objects and a cost of generating energy by the supply-side objects.

8. The system of claim 1, wherein the plurality of dependent objects comprises a first supply-side object.

9. The system of claim 8, wherein the schedule of net resources received from the first supply-side object comprises an indication of energy, power and capacitance to be generated by the first supply-side object during the first time period.

10. The system of claim 8, wherein the preference data received from the first supply-side object comprises at least one of:

a conditional preference during anomalous grid events;
a preference for avoiding negative grid conditions; and
a preference for maintaining a predetermined balance between generation phases.

11. The system of claim 1, wherein the plurality of dependent objects comprise at least one generation supply-side object and at least one transmission supply-side object.

12. The system of claim 1, wherein the plurality of dependent objects comprises a first demand-side object.

13. The system of claim 12, wherein a schedule of net demand received from the first demand-side object comprises an indication of energy, power and capacitance to be used by the demand-side object during the first time period.

14. The system of claim 12, wherein the preference data received from the first demand-side object comprises usage preferences from a customer associated with the demand-side object.

15. The system of claim 14, wherein the usage preferences comprise explicit preferences received directly from the customer and implicit preferences received through observation of the demand-side object.

16. The system of claim 14, wherein the usage preferences comprise customer billing preferences.

17. The system of claim 12, wherein each optimization engine is further programmed to cause the computer system to:
receive an indication of a location of a customer associated with the first demand-side object; and
modify at least one of a preference associated with the first demand-side object and a schedule of net demand received from the first demand-side object considering the location.

18. The system of claim 12, wherein each optimization engine is further programmed to cause the computer system to:
receive an indication of an activity of a customer associated with the first demand-side object; and
modify at least one of a preference associated with the first demand-side object and a schedule of net demand received from the first demand-side object based on the activity.

19. The system of claim 1, wherein the net energy usage is non-zero.

20. The system of claim 1, wherein the computer system comprises a communications node of an electric grid system comprising at least a portion of the supply-side objects and demand-side objects.

21. A computer-implemented method for optimizing energy usage, the method comprising:
receiving, by a computer system, dependent object attribute data associated with associated with a plurality of dependent objects of an optimization engine object executed by the computer system, the plurality of dependent objects comprising: a dependent optimization engine object; and at least one of a dependent supply-side object to generate energy and a dependent demand-side object to use energy, wherein the computer system comprises at least one processor and operatively associated memory, and wherein the dependent object attribute data for each dependent object comprises, for a first time period:
at least one attribute selected from the group consisting of: a schedule of net resources indicating supply-side capacity of the dependent object; and a schedule of net demand indicating demand-side usage of the dependent object; and
preference data indicating usage preferences associated with the dependent object;
determining, by the computer system, an optimal configuration for the plurality of dependent objects over the first time period subject to at least one optimization constraint, wherein determining the optimal configuration comprises determining a net energy usage of the plurality of dependent objects;
conditioned upon the optimization engine depending from a superior optimization engine, transmitting, by the computer system, the net energy usage to the superior optimization engine.

* * * * *